United States Patent [19]

Campisi et al.

[11] Patent Number: 4,663,821
[45] Date of Patent: May 12, 1987

[54] COMPONENT HANDLING APPARATUS

[75] Inventors: Carl Campisi, Chicago; Andrew W. Kaliszek, Des Plaines; Elmer M. Klein, Mundelein, all of Ill.

[73] Assignee: Zenith Electronics Corporation, Glenview, Ill.

[21] Appl. No.: 810,436

[22] Filed: Dec. 16, 1985

[51] Int. Cl.⁴ .................... B23P 23/00; B23Q 7/08
[52] U.S. Cl. ................................ 29/564.2; 29/741
[58] Field of Search ............... 29/739, 741, 715, 718, 29/33 K, 33 P, 33 M, 564.2, 564.6, 566, 566.2, 566.3, 845, 563, 564.8, 837; 140/147

[56] References Cited

U.S. PATENT DOCUMENTS

| | | | |
|---|---|---|---|
| 2,902,689 | 9/1959 | Petersen | 29/566.3 |
| 3,765,075 | 10/1973 | Olney, Jr. et al. | 29/739 X |
| 3,932,931 | 1/1976 | Wright | 29/739 X |
| 4,069,579 | 1/1978 | Liu | 29/741 X |
| 4,070,753 | 1/1978 | Liu | 29/741 |
| 4,206,539 | 6/1980 | Weresch | 29/33 M X |
| 4,387,500 | 6/1983 | Weresch | 29/566.3 |
| 4,434,550 | 3/1984 | Wilke | 29/741 X |
| 4,520,549 | 6/1985 | Whitley et al. | 29/566.3 |
| 4,543,713 | 10/1985 | Rapp | 29/741 |
| 4,567,652 | 2/1986 | Gussman et al. | 29/741 X |
| 4,573,254 | 3/1986 | Kirk et al. | 29/566.3 |
| 4,586,251 | 5/1986 | Kinoshita et al. | 29/741 |

FOREIGN PATENT DOCUMENTS

| | | | |
|---|---|---|---|
| 3311792 | 10/1984 | Fed. Rep. of Germany | 29/739 |
| 153752 | 11/1981 | Japan | 29/741 |
| 2124936 | 2/1984 | United Kingdom | 29/33 M |
| 772793 | 10/1980 | U.S.S.R. | 29/33 K |
| 828265 | 5/1981 | U.S.S.R. | 29/739 |
| 990470 | 1/1983 | U.S.S.R. | 29/563 |
| 1042218 | 9/1983 | U.S.S.R. | 29/33 M |

Primary Examiner—William R. Briggs

[57] ABSTRACT

A pneumatically actuated, electrically controlled electronic component handling apparatus straightens out the leads of an electronic component, positions and orients the component for engagement by an automatic gripper device, and determines the exact orientation of the component for subsequent testing, assembly or insertion of the component in circuit. As a component exits a vibrating delivery chute, a first pneumatic cylinder places a component stop in position to prevent the exit of additional components from the chute. With the discharged component engaged from above by a second pneumatic cylinder actuated pusher, a third pneumatic cylinder raises a component carriage in engagement with a lower portion of the component. The carriage includes a pair of elongated slots therein having enlarged openings for receiving and straightening a respective component lead inserted therein. A fourth pneumatic cylinder then laterally displaces the carriage to a pick-up point where the component is engaged and removed from the carriage by a robotic gripper. Before removal, an optical senser directs a light beam upon the marked component to determine its relative orientation with respect to the gripper to ensure proper subsequent manipulation of the component. Various optical and electrical sensors are employed to control the sequence of pneumatic operations in the component handling apparatus.

16 Claims, 8 Drawing Figures

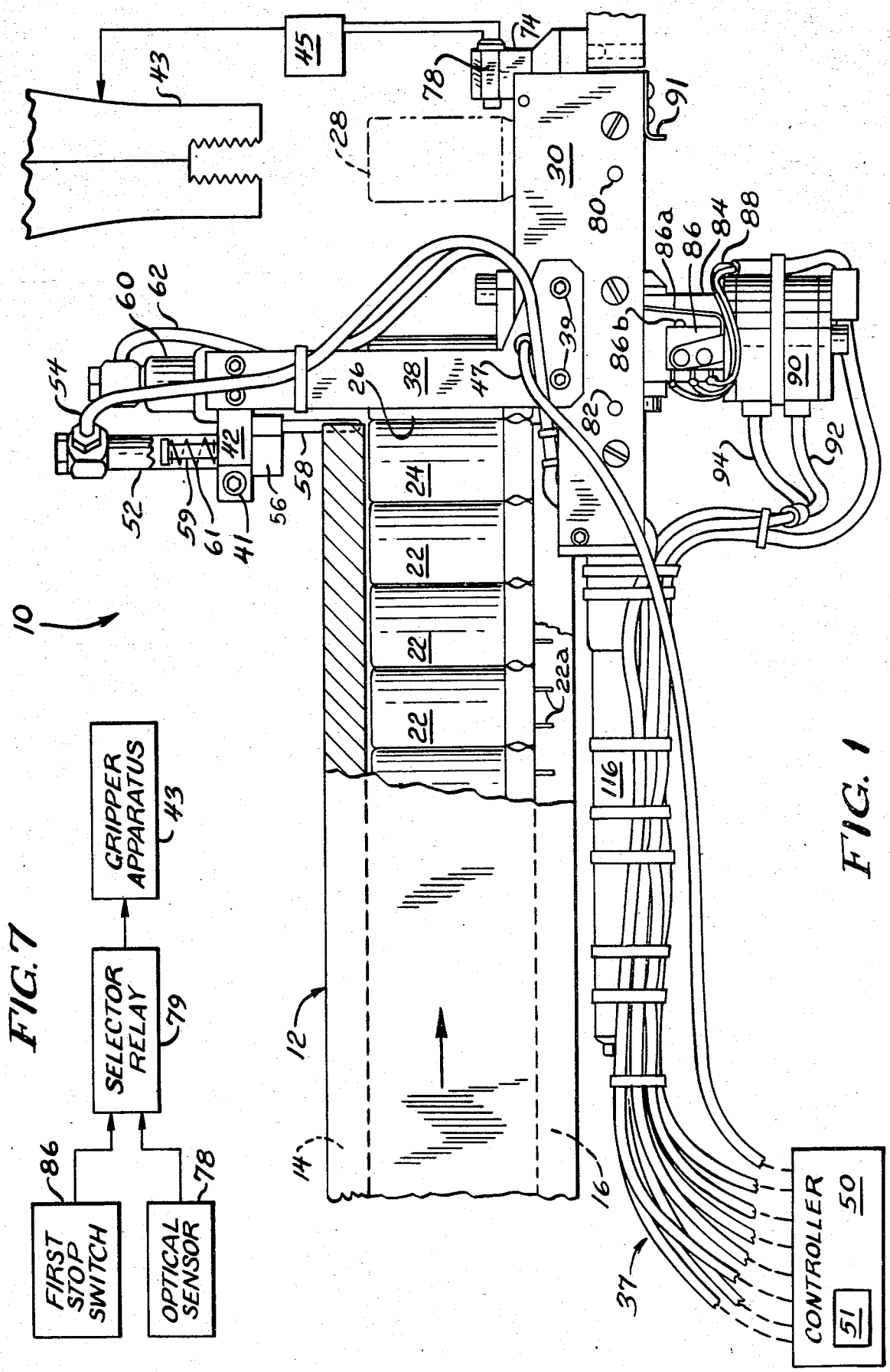

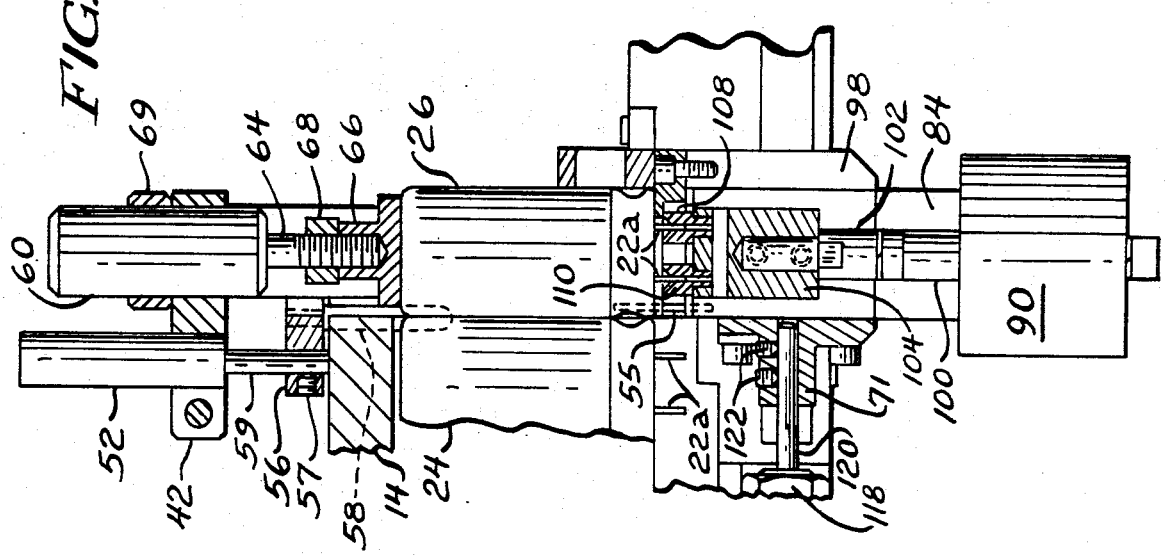
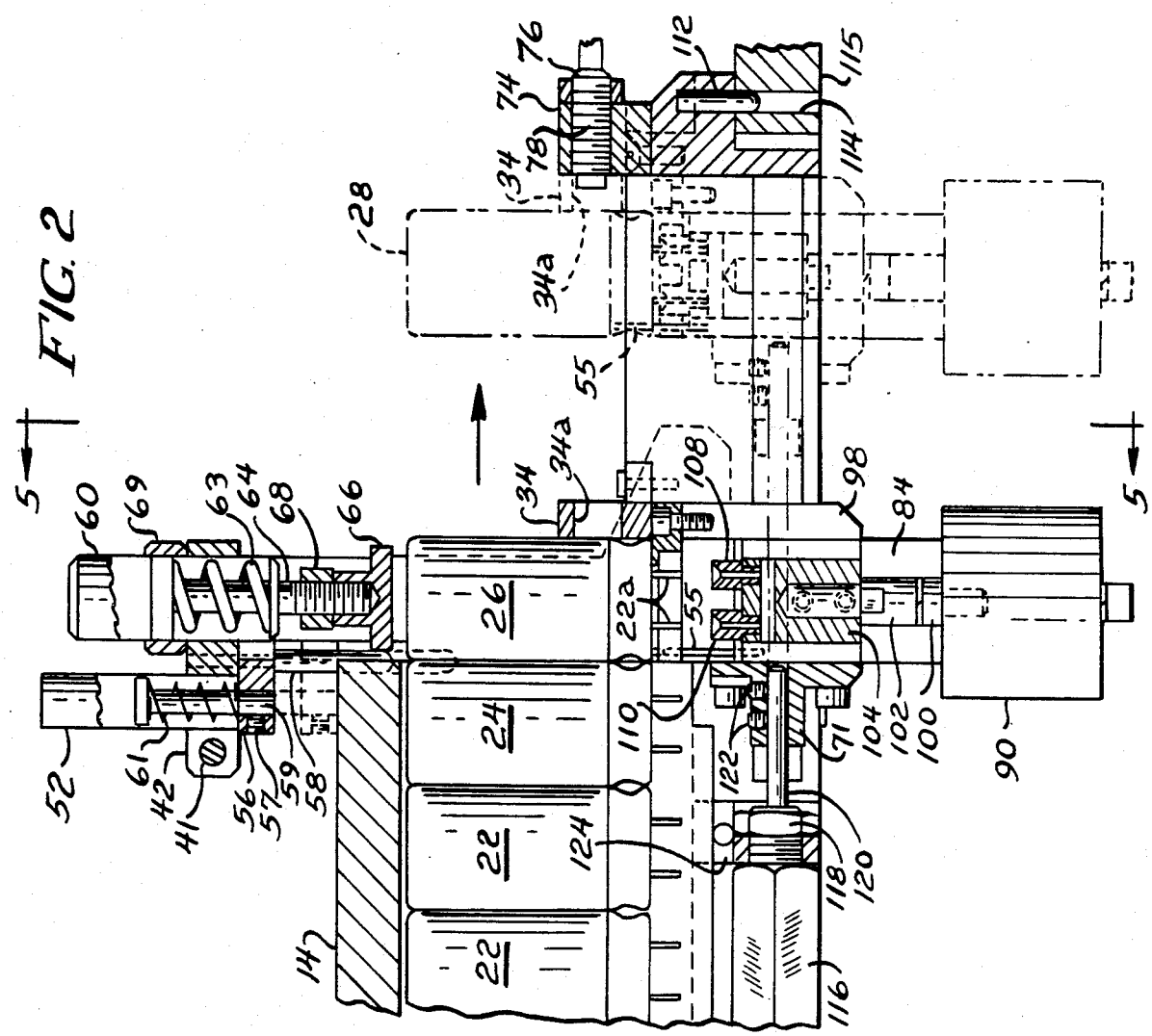

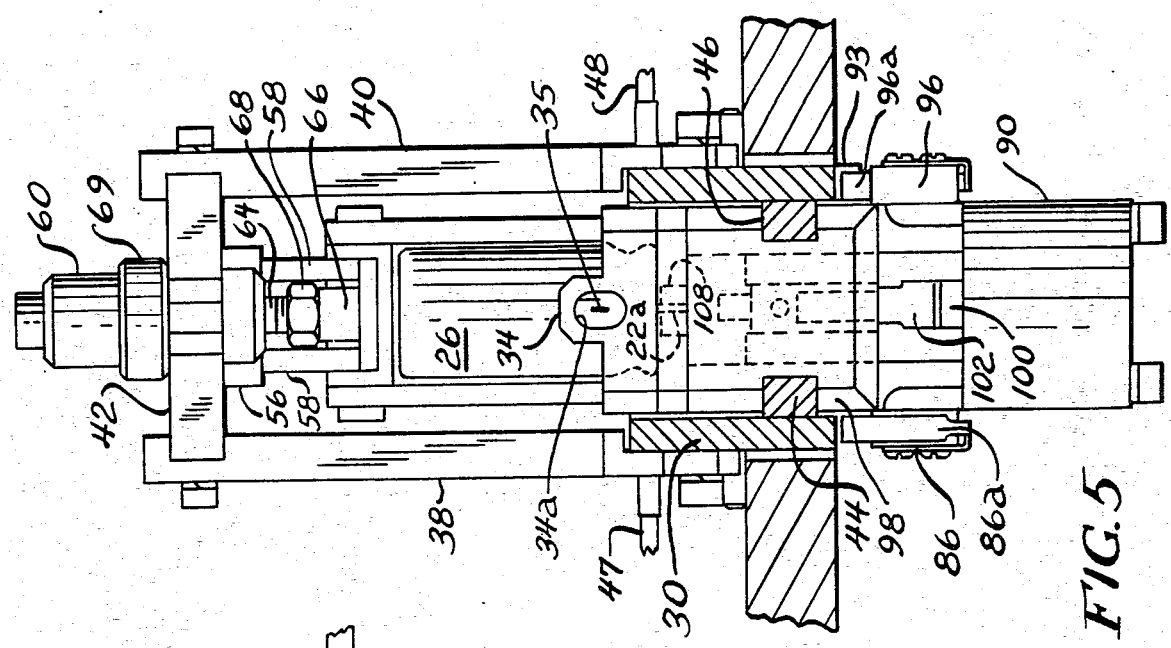
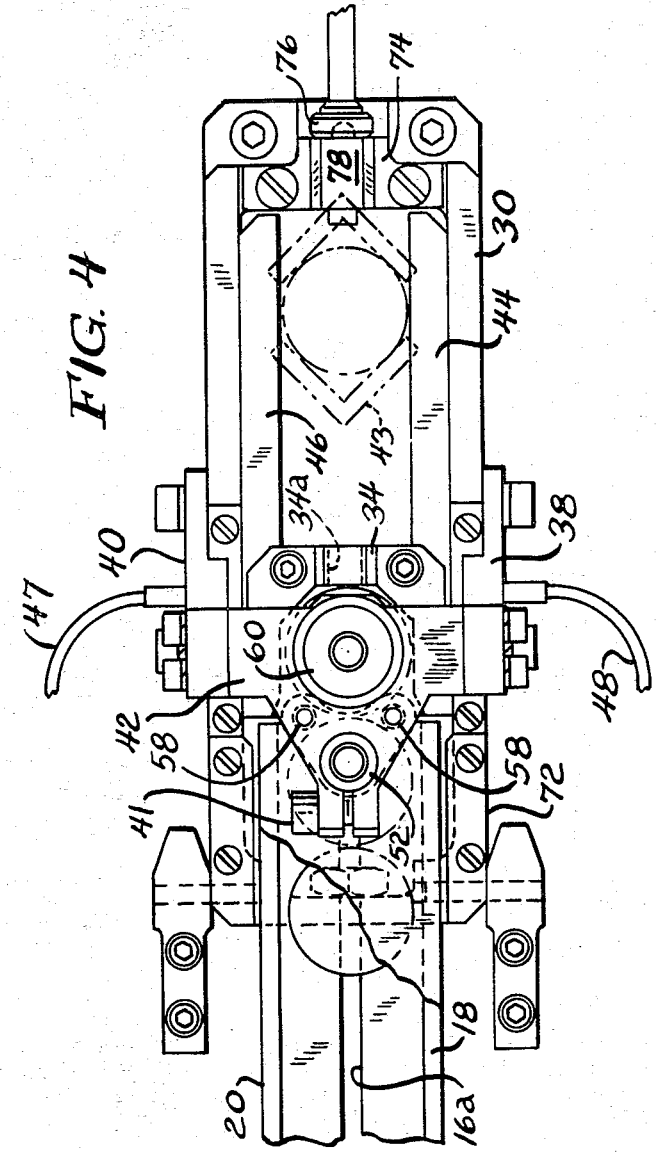

COMPONENT HANDLING APPARATUS

BACKGROUND OF THE INVENTION

This invention relates generally to the automatic handling of electronic components and is particularly directed to the automatic orienting and positioning of electronic components for engagement by a robotic gripper.

The high speed assembly of circuit boards makes use of automatic component insertion equipment for the positioning of electronic components upon the circuit board, or substrate. The component is typically positioned upon a first side of a circuit board with its conductive leads inserted through predrilled apertures in the board. The component leads are then crimped on a second side of the circuit board for electrical coupling with linear conductors typically in the form of metal foil. In this type of automatic circuit board assembly arrangement, a conveyor typically displaces the board to sequentially arranged work stations whereat various components are mounted on the circuit board by means of a numerically controlled component insertion apparatus. Because the economics of circuit board assembly requires high speed operation and the aforementioned component insertion apparatus typically possesses limited positioning and component grasping flexibility, a highly accurate component delivery arrangement is necessary for proper positioning and orientation of the electronic component prior to engagement by the automatic insertion apparatus.

In the automatic feeding of electronic components, the fewer times the component is re-oriented during the feeding process the less the likelihood of misplacement or misalignment of the component handling apparatus and the less likely is the component handling apparatus to be obstructed and an interruption in component delivery to occur. Ideally, each component is fed in sequence to a precisely defined location in a predetermined orientation without any re-positioning or re-orienting of the component necessary from when it exits the component feed apparatus to its engagement and removal by the component gripper apparatus. One example of a 90° re-orientation of the electronic component following its exit from a delivery tube can be found in U.S. patent application Ser. No. 650,934, filed Sept. 14, 1984 in the names of Carl Campisi and Richard Schmid and assigned to the assignee of the present application. The high, speed, 90° rotational displacement of each of the deposited components prior to engagement by a gripper mechanism increases the likelihood of component displacement from the positioning apparatus and either the failure to insert a component in circuit or a jamming of the component delivery system.

Prior art component delivery mechanisms frequently utilize a gravity feed arrangement wherein each electronic component is deposited by gravity upon a carriage assembly. This downward displacement by gravity of the electronic components through an opening in a lower portion of a delivery tube frequently causes a re-orientation of the electronic component resulting in its misalignment with the component receiver or jamming of the component delivery mechanism such that linear displacement of the component delivery mechanism may be inhibited or even prevented. Moreover, elaborate precautions must typically be implemented in order to prevent the deposit from the feeder tube of only a single component at a time as the simultaneous deposit of more than one component will necessarily jam a delivery mechanism having precisely defined dimensional tolerances necessitated by the continuous, rapid movement of the component displacement assembly. Jamming of the delivery mechanism causes an interruption in the automatic feeding process and may even damage the mechanism.

The component handling apparatus of the present invention addresses these and other problems encountered in the prior art by handling the electronic components in a manner which does not require component re-orientation in positioning it for grasping and displacement by a robotic gripper. The component handling apparatus of the present invention provides component lead straightening, precisely determines component orientation by means of an optical sensor, and displaces the component a minimal distance prior to engagement by the gripper mechanism.

OBJECTS OF THE INVENTION

Accordingly, it is an object of the present invention to provide an improved automatic handling apparatus for use in the manipulation and positioning of electronic components.

It is another object of the present invention to provide high speed, accurate and reliable positioning of individual circuit components prior to automatic mounting and connecting in circuit on a circuit board.

Yet another object of the present invention is to provide for the automatic, continuous and repetitive delivery of electronic components to a designated position and in a desired orientation for subsequent mounting on a circuit board by means of automatic insertion equipment.

A further object of the present invention is to provide an improved arrangement for the automatic insertion of electronic components on a circuit board.

Still another object of the present invention is to provide an improved pneumatically actuated, electrically controlled automatic feed apparatus for use in the high speed positioning of electronic components in a desired orientation.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

FIG. 1 is a partially cutaway lateral view of a component handling apparatus in accordance with the present invention;

FIG. 2 is a lateral sectional view of a portion of the component handling apparatus of FIG. 1 illustrating the displacement of an electronic component therein;

FIG. 3 is a partial lateral sectional view of the component handling apparatus illustrating the manner in which a component is maintained in position upon a component carriage assembly for straightening the component leads;

FIG. 4 is a partially cutaway top plan view of a component handling apparatus in accordance with the present invention;

FIG. 5 is a front elevational view shown partially in phantom of the component handling apparatus of FIG. 1;

FIG. 7 is a simplified block diagram illustrating the interface between a robotic component gripper and the control circuit of FIG. 6.

DETAILED DESCRIPTION OF THE PREFERRED EMBODIMENT

Figure 6:
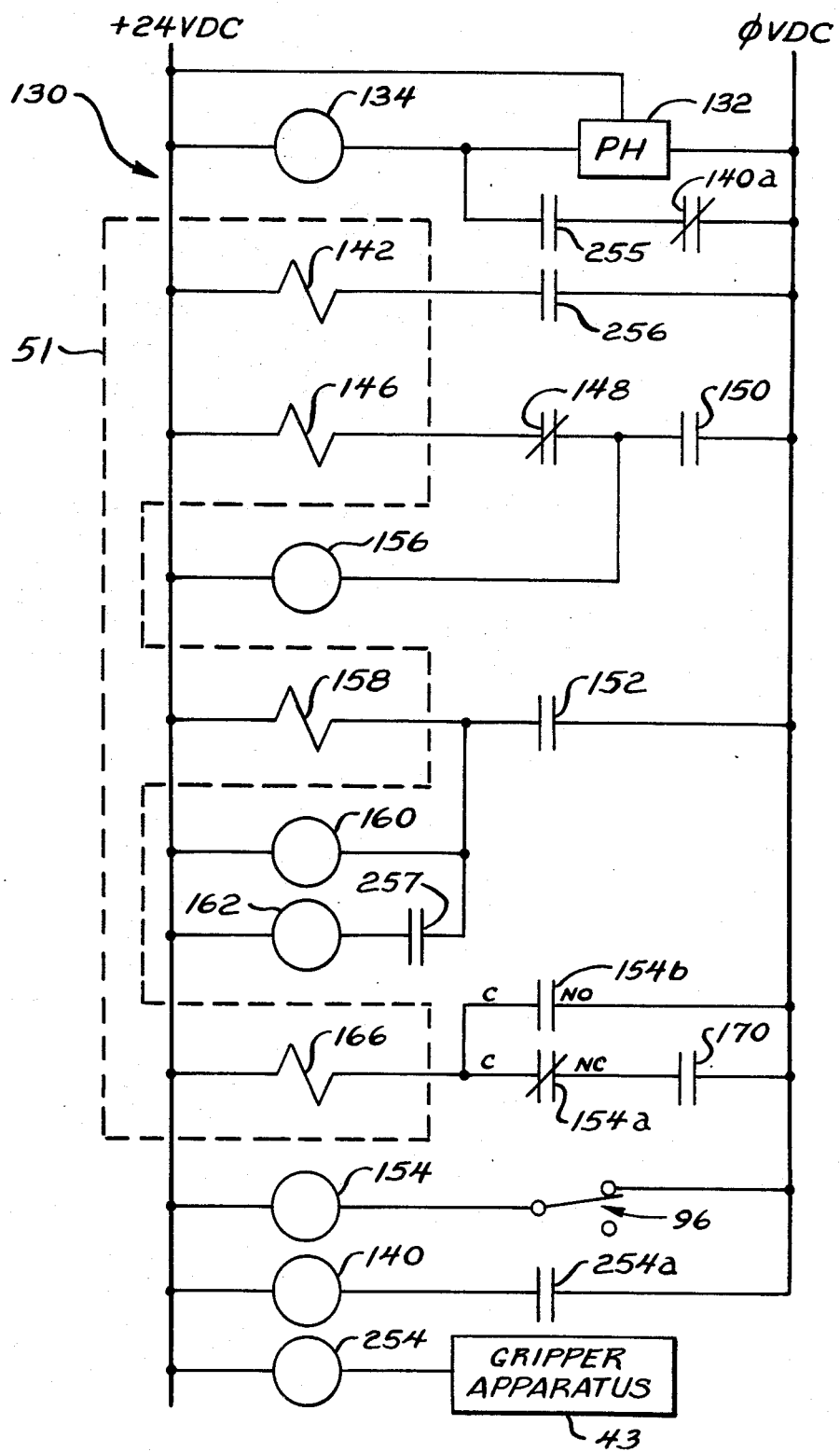
FIG. 6 is a combined block and schematic diagram of a control circuit for use in the component handling apparatus.

Referring to FIGS. 1 through 5, there are shown various views of a component handling apparatus 10 in accordance with the present invention. More specifically, FIG. 1 shows a partially cutaway lateral elevational view of the component handling apparatus, while FIGS. 2 and 3 are lateral sectional views of the component handling apparatus of FIG. 1. FIG. 4 is a top planar, partially cutaway view of the component handling apparatus, while FIG. 5 is a front elevational view shown partially in phantom of the component handling apparatus of the present invention. In the following description, the terms left and right designate the relative position of various components within the component handling apparatus as viewed from the direction toward which electronic components positioned therein are displaced. Also in the following detailed description, forward portions of the apparatus are positioned adjacent to where an electronic component is removed from the apparatus while those portions adjacent to where the components are deposited on the apparatus are described as to the rear of the apparatus. Finally, the order in which various elements of the component handling apparatus 10 of the present invention are discussed is generally in accordance with the sequence of operation of the apparatus in the handling of electronic components positioned therein.

The component handling apparatus 10 generally includes a support frame comprised of various structural members for supporting various operating assemblies of the apparatus. More specifically, the support frame includes left and right generally vertically oriented mounting brackets 38, 40. To a lower end of the left mounting bracket 38 is mounted a generally horizontally oriented left side of housing base 30. Similarly, to a lower end portion of the right mounting bracket 40 is mounted a right side of housing base 30. The aforementioned left and right hand portions of the support frame of the component handling apparatus 10 are securely coupled together by means of a plurality of bolt combinations 39 extending therebetween.

A cover assembly 72 is securely mounted to an aft portion of each of the left and right sides of housing base 30, and is adapted to receive and engage one end of a component feeder 12. The component feeder 12 is of the vibratory type and includes a top panel 14, a bottom panel 16 having a slot 16a extending along the length thereof, and left and right panels 18, 20. The thus configured component feeder 12 is thus generally rectangular in cross section and provides a substantially enclosed, tube-like structure having a slot 16a located in the lower surface and extending the length thereof. The component feeder 12 is coupled to and displaced by a conventional vibrating driver mechanism (not shown) and is adapted to receive at one end thereof a plurality of electronic components 22 having at least one component lead or terminal 22a extending therefrom. The vibratory action of the component feeder 12 results in the displacement of the components 22 inserted in a first end thereof toward a second end thereof where the components exit the component feeder 12. In the present invention, the second end of the component feeder 12 from which the components 22 exit is positioned adjacent to and is aligned with the aft portion of the housing base 30. The slot 16a in the bottom panel 16 of the component feeder 12 is adapted to receive a component lead (or leads) extending from an electronic component positioned within and displaced along the component feeder. In the present case, the component handling apparatus 10 is described as used in the positioning of electrolytic capacitors 22 having a pair of leads 22a extending from a flat, end surface thereof which are aligned along a center line of the capacitor. The present invention, however, is not limited to use with such electronic components, but is compatible with virtually any electronic component having any number of component leads extending therefrom in virtually any configuration. Differences in the number and configuration of the leads extending from an electronic component can be accommodated in the present invention by providing a corresponding number of properly spaced slots in the lower surface of the component feeder as well as incorporating associated changes in a component carriage described in detail below. Such changes to the apparatus described herein are within the scope of those skilled in the relevant arts.

As shown in the various figures, a plurality of electronic components 22 are positioned in a linear arrangement within the component feeder 12. Component 24 is located immediately adjacent to the end of the component feeder 12 and is the next component to be discharged therefrom. Component 26 has been displaced from the component feeder 12 and is positioned within and supported by the component handling apparatus 10. Also as shown in the various figures, the component handling apparatus 10 provides for the rightward displacement of an electronic component positioned thereon as illustrated in phantom by the location of component 28 which has just been displaced from the present location of component 26 to the location shown in FIGS. 1 and 2 for engagement and removal by a robotic gripper apparatus 43 as shown in FIGS. 1 and 4. A mounting bracket 74 is coupled to a forward end portion of the housing base 30 by means of bolts or screws. A locating pin 112 inserted in the slot 114 of a support structure 115 provides proper alignment of the forward portion of the component handling apparatus 10 relative to the support structure.

The component handling apparatus 10 includes a plurality of pneumatic cylinders described in detail below which are coupled by means of various air tubes 37 to a controller 50. The controller 50 is also electrically coupled to various elements of the component handling apparatus 10 and includes timing circuitry for generating various timed signals for sequentially actuating the various aforementioned pneumatic cylinders in a predetermined sequence for the automatic manipulation and positioning of the electronic components in accordance with the present invention. The controller 50 includes a pneumatic pressure source 51 and a number of solenoid valves that may be conventional in design and operation and are responsive to the aforementioned electrical signals provided thereto within controller 50 for providing air under pressure to the various pneumatic cylinders in a predetermined sequence as described in the following paragraphs.

As each of the electronic components is displaced along the length of the component feeder 12 and out of the end thereof they are positioned immediately above a component carriage assembly 98 within the component handling apparatus 10 as shown for the case of component 26. Mounted to respective lateral portions of the housing base 30 is a component sensor input fiber optic probe 47 and a component sensor output fiber optic probe 48. The component sensor input and output fiber optic probes 47, 48 are coupled to the controller 50, although this is shown in the figures only for the case of the sensor input lead for simplicity. The component sensor input fiber optic probe 47 directs a light beam across the component handling apparatus 10 for detecting the positioning of the electronic component 26 between the left and right mounting brackets 38, 40 and immediately above the component carriage 98. When the light beam thus directed across the component handling apparatus 10 is interrupted by the presence of component 26, the component sensor output fiber optic probe 48 provides an appropriate signal to the controller 50 which responds by actuating the pneumatic pressure source 51 for sequentially actuating various pneumatic cylinders as described in detail in the following paragraphs.

The first pneumatic cylinder actuated is a generally vertically oriented stopper air cylinder 52 mounted to respective upper portions of the left and right mounting brackets 38, 40 by means of the combination of a mounting screw 41 and a pusher plate 42. The stopper air cylinder 52 is coupled to the controller 50 via an air tube 54 and includes an extendible cylinder rod 59 which is biased upward by means of a coiled spring 61 within the stopper air cylinder 52. The stopper air cylinder rod 59 is coupled to a stopper housing 56 by means of a set screw 57. Extension and retraction of the cylinder rod 59 results in a corresponding vertically downward and upward displacement of the stopper housing 56. Positioned within the stopper housing 56 and extending downward therefrom are a pair of spaced stop pins 58. Because of the generally curvilinear cross section of each of the electronic components, downward displacement of the combination of the stopper housing 56 and stop pins 58 positioned therein results in the positioning of the stopper pins between electronic components 24 and 26. This prevents further rightward displacement of electronic component 24 and those components positioned to the left thereof.

With the stopper air cylinder rod 59 extended and the stop pins 58 displaced downward and positioned between components 24 and 26, a pusher air cylinder 60 coupled to the controller 50 via an air tube 62 is actuated by the controller following a predetermined time interval established by appropriate circuitry within the controller as described below. Actuation of the pusher air cylinder 60 results in the downward displacement of its cylinder rod 64 to the distal end of which is threadably mounted a component pusher 66. The component pusher 66 is securely maintained in position upon the cylinder rod 64 by means of a mounting nut 68. The lower end portion of the component pusher 66 is adapted to contact and engage the upper end portion of a component 26 positioned immediately above the component carriage 98. Thus, actuation of the pusher air cylinder 60 results in downward displacement of the component pusher 66 which engages the electronic component 26 and securely maintains it in position upon the top plate 98a of the carriage 98 as shown in FIG. 2. The pusher air cylinder 60 is also mounted to the respective upper ends of the left and right mounting brackets 38, 40 by means of the pusher plate 42 and is maintained in position thereon by means of a nut 69. As in the case of the stopper air cylinder 62, the cylinder rod 64 within the pusher air cylinder 60 is biased upward by means of a coiled spring 63 positioned within the pusher air cylinder. Thus, when air under pressure is no longer provided from the controller 50 via air tube 62 to the upper end of the pusher air cylinder 60, its cylinder rod 64 is displaced upwardly by means of the coiled spring 63 resulting in the raising of the component pusher 66 and release of the electronic component 26.

Following engagement of the component 26 by the component pusher 66, another timed output signal is generated within the controller 50 for actuating the pneumatic pressure source 51 therein for providing air under pressure via air tube 92 to a carriage air cylinder 90. The carriage air cylinder 90 is mounted to a lower portion of the component carriage 98. The carriage air cylinder 90 includes a cylinder rod 100 positioned therein to which is coupled a vertically displaceable carrier insert 104 by means of an insert coupler 102. The carrier insert 104 is slideably positioned within the component carrier 98 and is vertically displaceable therein up to the bottom surface of carriage top plate 98a. Positioned on an upper portion of the carrier insert 104 are forward and aft component lead alignment slots or tubular dies 108, 110. With the component engaged from above by the component pusher 66 as shown for the case of component 26, air under pressure is provided via a first air hose 92 to a lower portion of the carriage air cylinder 90 for vertically displacing upward the cylinder's rod 100 as well as the carrier insert 104 and the forward and aft lead alignment slots 108, 110. An upper end portion of each of the forward and aft lead alignment tubular dies 108, 110 is enlarged to receive a respective one of the component leads 22a as the lead alignment slots are displaced upward toward electronic component 26. Each of the lead alignment slots 108, 110 is adapted to receive a respective component lead 22a which is inserted therein and to provide for the straightening of the lead as well as for aligning both leads in parallel such that they extend generally perpendicular from the lower surface of the component 26. The enlarged upper portions of each of the forward and aft lead alignment slots 108, 110 allow for tolerances in the misalignment and nonlinearity of each of the component leads 22a while affording a lead alignment and straightening capability. The carriage air cylinder 90 is a double acting cylinder such that pneumatic pressure provided to a lower portion of the carriage air cylinder via air hose 92 generated in response to a timed output signal in the controller 50 provided to the pneumatic pressure source 51 displaces its cylinder rod 100 vertically upward. Air is also provided under pressure via air hose 94 to an upper portion of the carriage air cylinder 90 to lower the carriage insert 104 and the forward and aft lead alignment slots 108, 110 positioned thereon in a subsequent step as described below.

The next step in the manipulation of an electronic component by the component handling apparatus 10 involves a release of the air pressure within the air hose 62 to allow for the upward displacement of the pusher air cylinder rod 64 permitting the component pusher 66 to release the electronic component 26. This is followed by the application of pneumatic pressure via one of the air hoses 37 to a left hand portion of a lateral displacement cylinder 116. The lateral displacement air cylinder 116 is coupled to a rear part of the housing base 30 by means of a mounting nut 118 positioned beneath the component feeder 12. The lateral displacement air cylinder 116 includes a cylinder rod 120 extending rightward therefrom. The lateral displacement air cylinder's rod 120 is, in turn, securely coupled by means of a pair of set screws 122 to a carrier coupler bracket 71 which, in turn, is coupled to and integral with the component carriage 98. Application of air under pressure to a left hand portion of the lateral displacement air cylinder 116 results in an extension of the cylinder rod 120 therefrom and the rightward displacement of the combination of the carriage air cylinder 90 and the component carriage 98 with an electronic component 26 positioned thereon. The component 26 is thus displaced rightward as shown by the direction of the arrow in FIG. 2 to a position as shown in phantom in FIGS. 1 and 2. From FIG. 2, it can be seen that the entire assembly of the carrier air cylinder 90 and the component carriage 98 is also displaced rightward in response to the extension of the cylinder rod 120 from the lateral displacement air cylinder 116.

Positioned in an aft, upper portion of the component carriage 98 and extending upward therefrom are a pair of carriage retaining pins 55. The carriage retaining pins 55 are positioned immediately aft of and in contact with a lower portion of the electronic component 26 positioned upon the top plate 98a of the component carriage 98. With the carriage insert 104 displaced upward, the carriage retaining pins 55 are positioned immediately adjacent to and in contact with a lower aft portion of the electronic component 26. Rightward displacement of the component carriage 98 in response to extension of the cylinder rod 120 from the lateral displacement air cylinder 116 results in a corresponding rightward displacement of the electronic component 26 positioned upon the component carriage. The carriage retaining pins 55 provide for the stable positioning of the electronic component 26 upon the component carriage top plate 98a as it is displaced rightward toward the position shown in dotted line form in FIG. 2.

Positioned on respective inner surfaces of each of the left and right sides of housing base 30 is a respective left and right rail 44, 46. Each of the left and right rails 44, 46 is adapted to engage a respective elongated lateral slot in the component carriage 98. Thus, the component carriage 98 is supported by the left and right rails 44, 46 and is adapted for sliding displacement along the length of the left and right sides of housing base 30.

Positioned on a left lateral portion of the component carriage 98 is a first stop switch 86 which includes a spring element 86a and a switch contact 86b. Positioned on a forward, lower portion of the left side of housing base 30 is a forward stop bracket 91. Upon rightward, or forward, displacement of the component carriage 98 to the full forward position, the forward stop bracket 91 engages and deflects rearwardly the switch spring element 86a. The switch spring element 86a thereupon engages the switch contact 86b. Following engagement of the switch contact 86b, the first stop switch 86 provides a first carriage position signal via one of the electrical leads 88 to the controller 50. In response to receipt of this first carriage position signal, rightward, or forward, displacement of the component carriage 98 is terminated by the removal of pneumatic pressure from a left hand portion of the lateral displacement air cylinder 116. After a predetermined time interval following the positioning of the component carriage 98 in the full forward position the electronic component 28 is allowed to be removed from the component carriage by the robotic gripper 43 and after a short delay, air under pressure is provided to a forward portion of the lateral displacement air cylinder 116 via one of the aforementioned air hoses 37 to displace the component carriage rearwardly in order to assume a position for receiving and engaging the next electronic component 24. Extending between the left and right lateral portions of the housing base 30 and coupled thereto are forward and aft roll pins 80, 82 which engage the left and right rails 44, 46 and provide support therefor.

A forward, upper portion of the component carriage 98 includes a displacement limiter 34 having an aperture 34a therein. The displacement limiter 34 limits forward displacement of an electronic component on the top plate 98a of the component carriage 98. As shown in FIG. 5, each of the electronic components 26 is provided on a lower, lateral portion thereof with a lightened polarity mark 35. The polarity mark 35 is aligned with the component leads 22a such that the polarity mark is visible through the limiter aperture 34a when the component is oriented as shown in FIG. 5. Similarly, when the orientation of the electronic component 26 is reversed with its leads 22a positioned within the slot 16a in the bottom panel 16, the polarity mark 35 is positioned on an aft portion of the electronic component 26 and is not visible through the aperture 34a.

Coupled to a forward portion of the housing base 30 is a mounting bracket 74. Positioned within the mounting bracket 74 and securely maintained therein by means of a mounting nut 76 is a color fiber optical retro-reflective sensor 78. The optical sensor 78 is aligned with the limiter aperture 34a such that with the component carriage 98 in the full forward position, the optical sensor directs an optical beam through the limiter aperture onto a forward, lower, lateral portion of an electronic component positioned on the component carrier. The amount of light reflected from the thus positioned electronic component is determined by its orientation upon the component carriage 98. For example, if the polarity mark 35 is on a forward portion of the electronic component, an increased amount of light will be reflected back to the optical sensor 78, while if the polarity mark is on an aft portion of the electronic component, a reduced amount of light will be reflected back to the optical sensor. In this manner, the optical sensor 78 determines the orientation and thus the polarity of the electronic component positioned upon the component carriage 98. Component polarity information is provided from the optical sensor 78 to a robotic gripper apparatus controller 45 for controlling the operation of the robotic gripper apparatus 43 as the electronic component is positioned in circuit by the gripper apparatus. This ensures proper positioning of the electronic components as they are connected in circuit following their positioning and orientation by the component handling apparatus 10 of the present invention.

Positioned on a right hand portion of the component carriage 98 as shown in FIG. 5 is a second stop switch 96. The second stop switch 96 includes a spring element 96a on an aft portion thereof which is adapted to engage an aft stop bracket 93 positioned on a lower, intermediate portion of the right housing base 32. Rearward displacement of the component carriage 98 following removal of a component therefrom causes the spring element 96a to engage the aft stop mounting bracket 93 resulting in an aft stop signal being provided from the second stop switch 96 to the controller 50 via an electrical lead (not shown) so as to stop the rearward displacement of the component carriage and ensure its positioning directly beneath the component pusher 66 for receiving the next electronic component displaced onto the component carriage. Rearward displacement of the component carriage 98 is effected by providing air under pressure from the controller 50 via an air hose to a forward portion of the lateral displacement air cylinder 116 resulting in the retraction of its cylinder rod 120.

After the component carriage 98 is displaced rearward to a position immediately beneath the component pusher 66, the cylinder rod 100 of the carriage air cylinder 90 is displaced downward by air under pressure provided from the controller 50 via air hose 94 to an upper portion of the carriage air cylinder. Retraction of rod 100 into the carriage air cylinder 90 results in a corresponding downward displacement of the carriage insert 104 and the forward and aft lead alignment slots 108, 110 positioned on an upper portion thereof. Next, the pressure within air hose 54 is reduced by the controller 50 to allow the coil spring 61 to urge the cylinder rod 59 within the stopper air cylinder 52 upward to a retracted position. Retraction of the stopper air cylinder rod 59 results in a corresponding upward displacement of the stopper housing 56 and the stop pins 58 extending downward therefrom. Upward displacement of the stop pins 58 to a position as shown in FIG. 1 permits the next electronic component 24 to be displaced rightward by the vibratory action of the component feeder 12 into a position immediately beneath the component pusher 66 and immediately above the component carriage top plate. Following the upward displacement of the stop pins 58 allowing the next electronic component 24 to be positioned for sequential engagement by the component pusher 66 and the component carriage 98, pneumatic pressure is again applied via air hose 54 to an upper portion of the stopper air cylinder 54 resulting in the downward displacement of the stop pins 58 in preventing further rightward displacement of the remaining electronic components 22.

The following discussion describes in detail the operation of the controller 50 in generating the various control signals utilized in the operation of the component handling apparatus 10. Referring to FIG. 6, there is shown a schematic diagram of a circuit 130 for use in controller 50 in generating the various control signals discussed above. In the following discussion, various components described above are referred to in terms of an associated element number previously used and illustrated in various of the figures discussed above. The circuit in FIG. 6 is coupled to a +24 VDC input and provides various timed control outputs to a controlled pneumatic pressure source 51 to control the various pneumatic cylinders in the sequence of operations described above. The pneumatic pressure source 51 includes a plurality of solenoid valves 142, 146, 158 and 166 and operates as described in the following paragraphs.

The control circuit 130 includes a fiber optic beamswitch or photoswitch 132 coupled to the component sensor input and output fiber optic probes 47, 48 which is responsive to the interruption of a light beam directed therebetween. Interruption of a light beam between the input and output probes 47, 48 causes the photoswitch 132 to initiate operation of a first timer 134 which, in turn, initiates operation of the control circuit 130. The first timer 134 introduces a predetermined time delay of up to one-half second in order to eliminate the possibility of intermittent interruptions in the detection of the light beam by the photoswitch 132 from falsely indicating the positioning of an electronic component between the component sensor input and output probes 47, 48 and immediately beneath the component pusher 66. After the first timer 134 times out, contacts 150 are closed and solenoid valve 146 in the pneumatic pressure source 51 is actuated for displacing the component pusher 66 downward so as to engage an electronic component. The timing of the first timer 134 also energizes and initiates the operation of a second timer 156 and latches itself through contacts 255. The timing out of the second timer 156 actuates a solenoid valve 158 through contacts 152 resulting in an appropriate control signal being provided to the pneumatic pressure source 51 for the actuation of the carriage air cylinder 90 resulting in the upward displacement of the carriage insert 104 and the forward and aft lead alignment tubular dies 108, 110 positioned on an upper portion thereof. In addition, the timing out of the second timer 156 initiates the operation of a third timer 160 and upon the timing out of the third timer, contacts 148 are opened and contacts 257 are closed initiating the operation of a fourth timer 162. Upon timing out of the third timer 160, a control signal is provided through contacts 148 to the pneumatic pressure source 51 for release of the pneumatic pressure in line 54 and allowing for the upward biased displacement of the component pusher 66. Upon timing out of the fourth timer 162, the lateral displacement air cylinder 116 is actuated for displacing the component carrier 98 in a forward direction with an electronic component positioned thereon. The fourth timer 162 is actuated upon the closure of contacts 257. The timing out of the fourth timer closes contacts 256 and actuates solenoid valve 142 for actuating the lateral displacement air cylinder 116 in displacing the component carrier 98 and an electronic component positioned thereon in a forward direction toward the optical sensor 78. The coil of relay 140 is reset by contacts 254a and the coil of relay 254 is energized by an appropriate output from the gripper apparatus 43 following the removal of a component from the component carrier 98 by the gripper apparatus. The resetting of relay 140 deactivates the first timer 134 and opens contacts 150 and 255 and all components of the control circuit 30 revert to their initial conditions.

Figure 8:
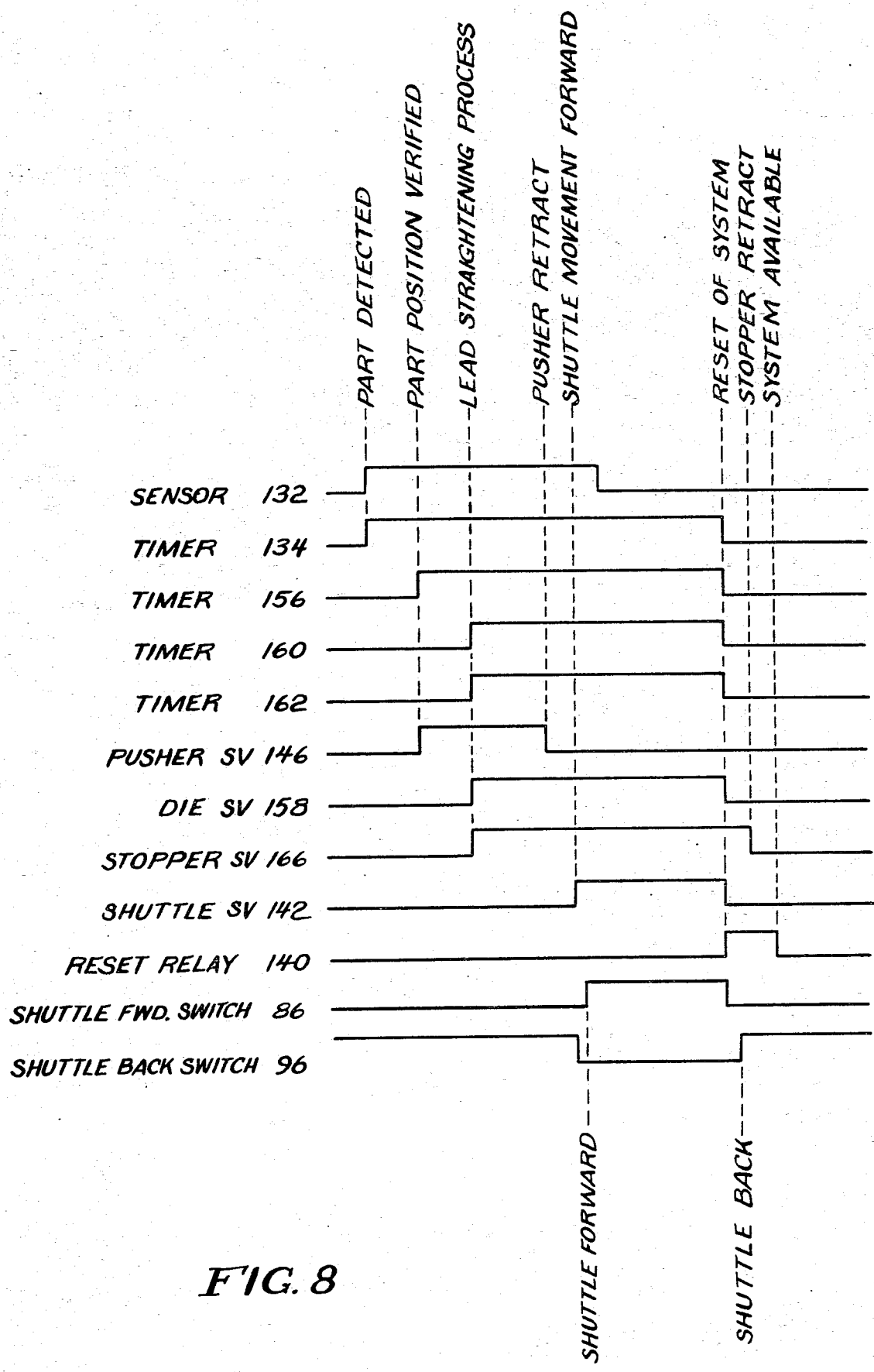
FIG. 8 is a timing diagram illustrating the sequence of operations carried out by the various components of the control circuit of FIG. 6.

Following timing out of the second timer 156, solenoid valve 166 is actuated through contacts 170, energizing the stopper air cylinder 52 resulting in the downward displacement of the stop pins 58. Following the forward displacement of the component carrier 98, control of the stopper air cylinder 52 is transferred to relay 154 which, in turn, is controlled by an output from the second stop switch 96. Upon timing out of the second timer 156, a control signal is provided via contacts 154a and 170 to the stopper solenoid valve 166 resulting in the actuation of the stopper air cylinder 52 and the downward displacement of the stopper pins 58. Forward displacement of the component carrier 98 transfers control of the stopper air cylinder 52 to relay 154, via contacts 154b, which is controlled by an input from the second stop switch 96. Thus, the stopper solenoid valve 166 is normally energized by contacts 154a and the timed out contacts 170 of the second timer 156. The control of the stopper solenoid valve 166 is then transferred to contacts 154b of relay 154, which is controlled by the second stop switch 96. When the second stop switch 96 is actuated upon full rearward displacement of the component carrier 98, the oontacts 154b which control the solenoid valve 166 are turned off. When the component carrier 98 is displaced forward, the second stop switch is disengaged resulting in the de-energizing of contacts 154a with contacts 170 no longer controlling the stopper solenoid valve 166. So long as the component carriage is positioned forward of the component pusher 66, the stopper solenoid valve 166 is energized and the stopper pins 58 are in the full downward position. When the component carriage 98 is in the full aft position, contacts 154b are not energized and the stopper solenoid valve 166 is de-activated allowing the stop pins 58 to be displaced upward and the next component to be positioned upon the component handling apparatus. A timing diagram illustrating the sequence of operations carried out by the various aforementioned components is shown in FIG. 8.

Referring to FIG. 7, there is shown a simplified blook diagram of the two inputs provided to a relay 79 for controlling the operation of the gripper apparatus 43. As shown in the figure, the first stop switch 86 provides an input to the gripper apparatus 43 via relay 79 for indicating to the gripper apparatus that the component carriage 98 is in position for an electronic component to be grasped by the gripper apparatus and removed from the component carriage. Another input from the optical sensor 78 is provided via relay 79 to the gripper apparatus 43 for indicating to the gripper apparatus the relative position, or polarity, of an electronic component positioned in the full forward position upon the component carriage immediately adjacent to the optical sensor 78. This information allows the gripper apparatus 43 to properly orient the electronic component prior to incorporation in an electrical circuit such as on a circuit board.

There has thus been shown a component handling apparatus for the automatic positioning and orienting of electronic components for engagement by a robotic gripper apparatus and automatic insertion in an electrical circuit. The component handling apparatus includes a plurality of electrical switches and pneumatically actuated cylinders for isolating each electronic component, precisely positioning a thus isolated component, determining the relative orientation or polarity of the component, and straightening and aligning the electrical leads of the component prior to engagement and removal by the robotic gripper apparatus.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. In the automatic positioning of electronic components sequentially discharged from a component delivery structure and engaged by a gripper device wherein each electronic component has a plurality of terminal leads extending therefrom, electronic component handling apparatus comprising:
   stopper means positioned adjacent to the component delivery structure for permitting only one electronic component at a time to be discharged therefrom;
   component carriage means positioned adjacent to the component delivery structure for receiving and supporting an electronic component discharged therefrom;
   alignment means coupled to said component carriage means for engaging and straightening each of the terminal leads and aligning each of the terminal leads in a generally parallel array; and
   displacement means coupled to said carriage means for displacing said carriage means and an electronic oomponent positioned thereon to a predetermined location for engagement and removal of the electronic component from the carriage means by the gripper device and for returning said carriage means adjacent to the component delivery structure for receiving a next electronic component.

2. The electronic component handling apparatus of claim 1 further comprising orientation detecting means positioned adjacent to said predetermined location and coupled to said gripper device for determining the relative orientation of an electronic component positioned on said carriage means with respect to the gripper device.

3. The electronic component handling apparatus of claim 2 wherein the electronic components are maintained in either a first or a second orientation within the component delivery structure and each of the electronic components has a polarity mark thereon and wherein said orientation detecting means includes a polarity detector for detecting the location of said polarity mark in determining the relative orientation of an electronic component positioned on said carriage means with respect to the gripper device.

4. The electronic component handling apparatus of claim 3 wherein said polarity detector includes a color fiber optical sensor for directing a light beam upon an electronic component positioned on said carriage means and for detecting light reflected therefrom, wherein the amount of light reflected therefrom is determined by the presence or absence of said polarity mark.

5. The electronic component handling apparatus of claim 1 wherein said stopper means includes in combination a pneumatic cylinder and a stop structure, with said stop structure positioned between a discharged component and a last component in the delivery structure in preventing the discharge thereof upon extension of said pneumatic cylinder and wherein said stop structure is removed between the discharged component and the last component in the delivery structure upon retraction of said pneumatic cylinder.

6. The electronic component handling apparatus of claim 1 wherein said alignment means includes a plurality of elongated, linear slots in an upper portion of said component carriage means and said component carriage means includes a pneumatic cylinder for displacing said component carriage means vertically upward whereupon each of the terminal leads is inserted in and straightened by a respective slot.

7. The electronic component handling apparatus of claim 6 wherein each of said elongated, linear slots in the upper portion of said component carriage means includes an enlarged upper end portion for receiving terminal leads having a range of straightness and alignment tolerances.

8. The electronic component handling apparatus of claim 7 wherein said component carriage means further includes component retaining means for engaging and maintaining in position an electronic component positioned thereon.

9. The electronic component handling apparatus of claim 8 wherein said component retaining means includes a plurality of pins extending upward from said component carriage means for engaging a lower, aft portion of an electronic component positioned thereon.

10. The electronic component handling apparatus of claim 1 wherein a lower portion of the component delivery structure includes a plurality of slots therein for receiving a respective terminal lead in maintaining the electronic components in alignment with a fixed orientation within the component delivery structure.

11. The electronic component handling apparatus of claim 1 wherein the component delivery structure includes a substantially enclosed elongated vibrating tube having an open end positioned adjacent to said component carriage means from which the electronic components are sequentially discharged.

12. The electronic component handling apparatus of claim 11 further comprising an optical sensor positioned adjacent to said component carriage means for detecting the discharge of an electronic component from the aperture in said vibrating tube and the positioning of said electronic component upon said component carriage means.

13. The electronic component handling apparatus of claim 12 wherein said optical sensor includes a photoswitch.

14. The electronic component handling apparatus of claim 1 wherein said displacement means includes a pneumatic cylinder having an extendible rod therein with the extension of said rod displacing said carriage means and an electronic component positioned thereon to said predetermined location and the retraction of said rod returning said carriage means adjacent to the component delivery structure for receiving a next electronic component.

15. The electronic component handling apparatus of claim 1 further comprising control means coupled to said stopper means, said alignment means and said displacement means for controlling the operation thereof.

16. The electronic component handling apparatus of claim 15 further comprising first and second position detectors mounted to said carriage means and coupled to said control means for respectively providing to said control means a first signal when said carriage means is at said predetermined location and a second signal when said carriage means is adjacent to the component delivery structure and wherein said control means provides a plurality of timed control signals to said stopper means, said alignment means and said displacement means for controlling the operation thereof.

* * * * *